(12) United States Patent
Trintchouk et al.

(10) Patent No.: US 7,643,522 B2
(45) Date of Patent: Jan. 5, 2010

(54) METHOD AND APPARATUS FOR GAS DISCHARGE LASER BANDWIDTH AND CENTER WAVELENGTH CONTROL

(75) Inventors: Fedor B. Trintchouk, San Diego, CA (US); Robert N. Jacques, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 745 days.

(21) Appl. No.: 11/254,282

(22) Filed: Oct. 20, 2005

(65) Prior Publication Data

US 2006/0114958 A1     Jun. 1, 2006

Related U.S. Application Data

(63) Continuation-in-part of application No. 11/000,571, filed on Nov. 30, 2004.

(51) Int. Cl.
*H01S 3/10* (2006.01)
*H01S 3/13* (2006.01)
*H01S 3/00* (2006.01)
*H01S 3/04* (2006.01)
*H01S 3/22* (2006.01)
*H01S 3/223* (2006.01)
*H01S 3/08* (2006.01)

(52) U.S. Cl. ............ 372/29.02; 372/25; 372/29.01; 372/29.011; 372/29.016; 372/29.023; 372/32; 372/33; 372/34; 372/38.1; 372/38.01; 372/38.02; 372/38.09; 372/55; 372/98; 372/99; 372/102

(58) Field of Classification Search ........... 372/25, 372/29.01, 29.011, 29.016, 29.023, 32, 33, 372/34, 38.1, 38.01, 38.02, 38.08, 38.09, 372/55, 98, 99, 102, 29.02

See application file for complete search history.

(56) References Cited

U.S. PATENT DOCUMENTS

| | | | |
|---|---|---|---|
| 5,095,492 A | 3/1992 | Sandstrom | 372/102 |
| 5,852,627 A | 12/1998 | Ershov | 372/108 |
| 5,898,725 A | 4/1999 | Fomenkov et al. | 372/102 |
| 5,978,409 A | 11/1999 | Das et al. | 372/100 |
| 6,005,879 A | 12/1999 | Sandstrom et al. | 372/25 |
| 6,028,879 A | 2/2000 | Ershov | 372/57 |
| 6,034,978 A * | 3/2000 | Ujazdowski et al. | 372/34 |
| 6,078,599 A | 6/2000 | Everage et al. | 372/20 |
| 6,094,448 A | 7/2000 | Fomenkov et al. | 372/102 |
| 6,141,081 A * | 10/2000 | Das et al. | 355/53 |
| 6,163,559 A | 12/2000 | Watson | 372/102 |
| 6,192,064 B1 | 2/2001 | Algots et al. | 372/99 |
| 6,212,217 B1 | 4/2001 | Erie et al. | 372/102 |

(Continued)

*Primary Examiner*—Kenneth A Parker
*Assistant Examiner*—Hrayr A. Sayadian (57) ABSTRACT

A gas discharge laser system bandwidth control mechanism and method of operation for controlling bandwidth in a laser output light pulse generated in the gas discharge laser system is disclosed which may comprise a bandwidth controller which may comprise an active bandwidth adjustment mechanism; a controller actively controlling the active bandwidth adjustment mechanism utilizing an algorithm implementing bandwidth thermal transient correction based upon a model of the impact of laser system operation on the wavefront of the laser light pulse being generated and line narrowed in the laser system as it is incident on the bandwidth adjustment mechanism. The controller algorithm may comprises a function of the power deposition history in at least a portion of an optical train of the gas discharge laser system, e.g., a linear function, e.g., a combination of a plurality of decay functions each comprising a respective decay time constant and a respective coefficient.

34 Claims, 6 Drawing Sheets

U.S. PATENT DOCUMENTS

| | | | |
|---|---|---|---|
| 6,317,447 B1 | 11/2001 | Partlo et al. | 372/57 |
| 6,408,260 B1 * | 6/2002 | Watts et al. | 702/188 |
| 6,493,374 B1 | 12/2002 | Fomenkov et al. | 372/102 |
| 6,496,528 B2 | 12/2002 | Titus et al. | 372/102 |
| 6,529,531 B1 | 3/2003 | Everage et al. | 372/20 |
| 6,532,247 B2 | 3/2003 | Spangler et al. | 172/57 |
| RE38,054 E | 4/2003 | Hofmann et al. | 372/25 |
| 6,567,450 B2 | 5/2003 | Myers et al. | 372/55 |
| 6,621,846 B1 | 9/2003 | Sandstrom et al. | 372/57 |
| 6,625,191 B2 | 9/2003 | Knowles et al. | 372/55 |
| 6,650,666 B2 | 11/2003 | Spangler et al. | 372/20 |
| 6,671,294 B2 | 12/2003 | Kroyan et al. | 372/20 |
| 6,690,704 B2 | 2/2004 | Fallon et al. | 372/58 |
| 6,721,340 B1 | 4/2004 | Fomenkov et al. | 372/25 |
| 6,735,225 B2 | 5/2004 | Albrecht et al. | 372/25 |
| 6,738,410 B2 | 5/2004 | Partlo et al. | 372/100 |
| 6,760,358 B1 | 7/2004 | Zimmerman et al. | 372/101 |
| 6,853,653 B2 | 2/2005 | Spangler et al. | 372/20 |
| 2002/0154668 A1 * | 10/2002 | Knowles et al. | 372/55 |
| 2004/0252740 A1 * | 12/2004 | Albrecht et al. | 372/55 |

* cited by examiner

METHOD AND APPARATUS FOR GAS DISCHARGE LASER BANDWIDTH AND CENTER WAVELENGTH CONTROL

RELATED APPLICATIONS

The present application is a continuation-in-part of U.S. patent application Ser. No. 11/000,571, entitled HIGH POWER, HIGH PULSE REPETITION RATE GAS DISCHARGE LASER SYSTEM BANDWIDTH MANAGEMENT, filed on Nov. 30, 2004and is related to co-pending U.S. patent application Ser. No. 10/935,249, entitled LASER OUTPUT LIGHT PULSE BEAM PARAMETER TRANSIENT CORRECTION, filed on Sep. 28, 2004, the disclosures of each of which are hereby incorporated by reference.

FIELD OF THE INVENTION

The present invention related to bandwidth and center wavelength control in line narrowed gas discharge laser systems, e.g., excimer or molecular fluorine gas discharge laser systems.

BACKGROUND OF THE INVENTION

Laser systems of the type noted above can exhibit bandwidth transients in response to duty cycle changes, whether of the single chamber or multi-chamber configuration, e.g., master oscillator/power amplifier ("MOPA") excimer laser systems, e.g., of the ArF or KrF variety. The transients are believed by applicant to be the result of thermally induced changes to laser light pulses in the laser system optical train, e.g., cylindrical wavefront deformation in the line narrowing module ("LNM") optics, optical coatings, and/or surrounding purge gas.

According to aspects of an embodiment of the present invention applicant proposes an apparatus and method for compensating for bandwidth and center wavelength transients with an actuated bandwidth control device ("BCD"), e.g., a mechanism for changing the curvature of the wavelength selection optical element, e.g., an eschelle grating, or a similar actuated optical element that can, e.g., introduce a cylindrical wavefront deformation on demand based, e.g., upon a feed forward controller algorithm.

SUMMARY OF THE INVENTION

A gas discharge laser system bandwidth control mechanism and method of operation for controlling bandwidth in a laser output light pulse generated in the gas discharge laser system is disclosed which may comprise a bandwidth controller which may comprise an active bandwidth adjustment mechanism; a controller actively controlling the active bandwidth adjustment mechanism utilizing an algorithm implementing bandwidth thermal transient correction based upon a model of the impact of laser system operation on the wavefront of the laser light pulse being generated and line narrowed in the laser system as it is incident on the bandwidth adjustment mechanism. The controller algorithm may comprises a function of the power deposition history in at least a portion of an optical train of the gas discharge laser system, e.g., a linear function, e.g., a combination of a plurality of decay functions each comprising a respective decay time constant and a respective coefficient. The plurality of decay functions may comprise up to three separate decay functions, and each may comprise a different decay time constant and a different coefficient. The apparatus and method may comprise a gas discharge laser system bandwidth control mechanism for controlling bandwidth in a laser output light pulse generated in the gas discharge laser system which may comprise a bandwidth controller which may comprise an active bandwidth adjustment mechanism which may comprise a dispersive optical element operative to select a center wavelength for the laser output light pulse and may further comprise a surface of incidence having an adjustable wavefront shape the effect of the wavefront shape on the bandwidth of a spectrum surrounding the selected center wavelength being represented by a curve plotting the bandwidth response to a selected curvature of the surface of incidence; a bandwidth controller controlling the adjustable wavefront shape utilizing an algorithm implementing bandwidth thermal transient correction based upon a model of the impact of laser system operation on the wavefront of the laser light incident on the surface of the bandwidth adjustment mechanism; wherein the bandwidth controller algorithm may be calibrated in a region of the curve where the bandwidth response to a selected change in curvature of the surface of incidence is relatively linear and the calibrated bandwidth controller algorithm is used for bandwidth thermal transient correction in a region of the curve where the bandwidth response to a selected change in curvature of the surface of incidence is relatively non-linear. The apparatus and method may comprise a gas discharge laser system bandwidth control mechanism for controlling bandwidth in a laser output light pulse generated in the gas discharge laser system which may comprise a bandwidth controller which may comprise an active bandwidth adjustment mechanism; a controller controlling the active bandwidth adjustment mechanism utilizing an algorithm which may comprise the implementation of short term bandwidth control based upon a model of the impact of laser system operation on the wavefront of the laser light pulse being generated and line narrowed in the laser system as it is incident on the bandwidth adjustment mechanism; and the implementation of long term bandwidth control based upon adjusting a halogen gas content in a lasing gas mixture in the gas discharge laser system. The apparatus and method may comprise a gas discharge laser system bandwidth control mechanism for controlling bandwidth in a laser output light pulse generated in the gas discharge laser system which may comprise a bandwidth controller which may comprise an active bandwidth adjustment mechanism; a controller controlling the active bandwidth adjustment mechanism utilizing an algorithm which may comprise a feed forward control function based upon a model of bandwidth fluctuation in response to a change in the time average of the heat load on at least a portion of the laser system optical train. The method and apparatus may comprise a gas discharge laser system bandwidth control mechanism for controlling bandwidth in a laser output light pulse generated in the gas discharge laser system which may comprise a bandwidth controller which may comprise a short term transient compensation mechanism which may comprise an active bandwidth adjustment mechanism which may comprise a dispersive optical element operative to select a center wavelength for the laser output light pulse and further may comprise a surface of incidence having an adjustable wavefront shape where the effect on the bandwidth of a spectrum surrounding the selected center wavelength can be represented by a curve plotting the bandwidth response to a selected curvature of the surface of incidence; a bandwidth controller algorithm implementing bandwidth thermal transient correction based upon a model of the impact of laser system operation on the wavefront of the laser light incident on the surface of the bandwidth adjustment mechanism; and a long term bandwidth control algorithm which may comprise adjusting a halogen gas content in a lasing gas mixture in the gas discharge laser system. The method and apparatus may comprise deriving the model from changes in bandwidth induced by changes in the curvature of the surface of incidence in a region of the curve where the response is relatively linear and using that model in a desired operating range of the laser system where the response is relatively non-linear.

DETAILED DESCRIPTION OF PREFERRED EMBODIMENTS

Figure 1:
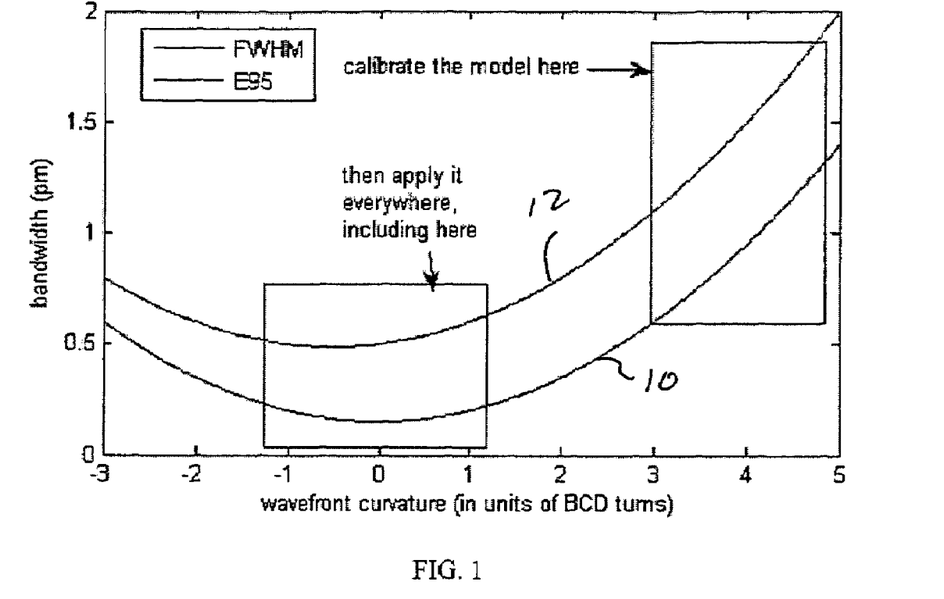
FIG. 1 shows a plot of bandwidth as a function of the curvature of a surface of incidence of a dispersive wavelength/bandwidth selection optical element according to aspects of an embodiment of the present invention.

Turning now to FIG. 1 there is shown a plot of bandwidth as a function of the curvature of a surface of incidence of a dispersive wavelength/bandwidth selection optical element according to aspects of an embodiment of the present invention. As shown by way of example in FIG. 1, bandwidth may be measured in the form of a width at some percentage of a maximum at a center wavelength, e.g., 50%, so-called full width half max ("FWHM") which is represented by a signal identified as D79 that is output from a fringe pattern detector and fringe width measurement instrument called a wavemeter in applicant's assignee's laser systems, e.g., 7XXX series single chamber laser systems and XLA-XXX series multichamber, e.g., MOPA, laser systems. This is shown as FWHM curve 20 in FIG. 1. It will be understood that a preferred embodiment could bend the grating. However, in general, the dispersive optical element or other wavelength selective optical element and the optical element with variable curvature need not be the same. A fixed-shape grating and a BCD attached to an Rmax mirror for changing the curvature of the wavefront reflected from the Rmax tuning mirror could also be used, as well as a combination of wavefront correction elements including a BCD for the grating and one or more other wavefront altering elements, for example.

Bandwidth can also be represented by a signal that applicant's assignee designates as D101 from the wavemeter, which can be, e.g., a signal representing the integration of the energy within a spectrum on either side of the peak value of intensity, such that some percentage, e.g., 95% of the spectrum energy is included within the measured width on either side of the peak, and also such that, therefore, each tail of the respective spectrum contains 2.5% of the spectrum energy, so-called E95% or E95. As can be seen from FIG. 1, the bandwidth out of a line narrowing module ("LNM") can be influenced by the curvature of an incidence receiving face of a center wavelength selection optical element. The center wavelength selection optical element may be, e.g., a dispersive optical element that returns to an optical path in the LNM light of a selected center wavelength depending on the angle of incidence on the optical element of the laser light pulse beam having its center wavelength selected. By the nature of the operation of such an optical element, the incidence surface of which may be, e.g., an eschelle grating, e.g., in a Littrow configuration as is well known in the art, a mismatch in the wavefront of the incident laser light pulse beam, e.g., which may be expanded to tens of mm of beam incident on the incidence face, can cause the bandwidth of the laser light pulse beam to change. This is due, e.g., to the distribution of angles of incidence over the longitudinal length of, e.g., the grating which results in many different center wavelengths being selected across the cross-section of the laser light pulse beam and an expansion or contraction of the bandwidth of the beam accordingly.

This curvature of the incidence face of the dispersive optical element may be represented by, e.g., the number of turns on a so-called bandwidth control device ("BCD"), which may be a simple as a mechanism to impart a curvature to the incidence face of the dispersive optical element, e.g., a simple cylindrical curvature, either concave or convex. As shown by way of illustration in FIG. 1, the positive side of the measure of curvature, e.g., the number of turns on a tension/compression inducing variable length bar, can represent concave generally cylindrical curvature on the incidence face of, e.g., the eschelle grating center wavelength selection optical element and the negative side can represent convex curvature.

As also can be seen from FIG. 1 by way of example, the minimum bandwidth at the bottom of the generally parabolic curves 10, 20, may be in the range of the center-point of BCD adjustment, e.g., at or around 0 turns positive or negative, with the FWHM curve 20 being at or almost at o turns and the minimum bandwidth setting for E95 being slightly skewed to the left in the region of about —½ turn. It will be understood that the specific BCD used and the consequent specific number of turns positive or negative on the BCD to change curvature of the incidence face of the optical element are not important to aspects of embodiments of the present invention. Rather the concept if that change of a physical parameter of the dispersive optical element that is sensitive to the wavefront of the laser light pulse beam being line narrowed in the LNM, e.g., curvature of the incidence face of the optical element can alter the bandwidth on either side of some minimum bandwidth and that the same change may be slightly different in impact for different measures of bandwidth, e.g., FWHM and E95.

FIG. 1 also illustrates that in regions of relatively large change in the parameter of the dispersive optical element, e.g., in the illustrative embodiment of FIG. 1 out beyond 3 positive turns or 2 negative turns, the change in bandwidth per concurrent change in BCD parameter, e.g., curvature, is relatively linear (assuming that turns on the BCD equates to linear change in, e.g., cylindrical curvature. In addition, it will also be apparent to those skilled in the art that in the region where it is most desirable to operate the BCD for bandwidth control, e.g., around the minimum bandwidth point for either FWHM or E95 such a change is relatively non-linear and even flips in sign on either side of the respective minimums. These curves 10, 20 can also be shifted right or left depending, e.g., on parameters of the laser operating system, e.g., the optical train, such as the amount of power in the system reflected in heat absorption in optical elements and thus a difference between so-called cold operation, e.g., before the optics have heated up and so-called "hot" operation, e.g., after some time running at some power level and duty cycle level, e.g., to achieve some "hot" steady-state operation.

Figure 2:
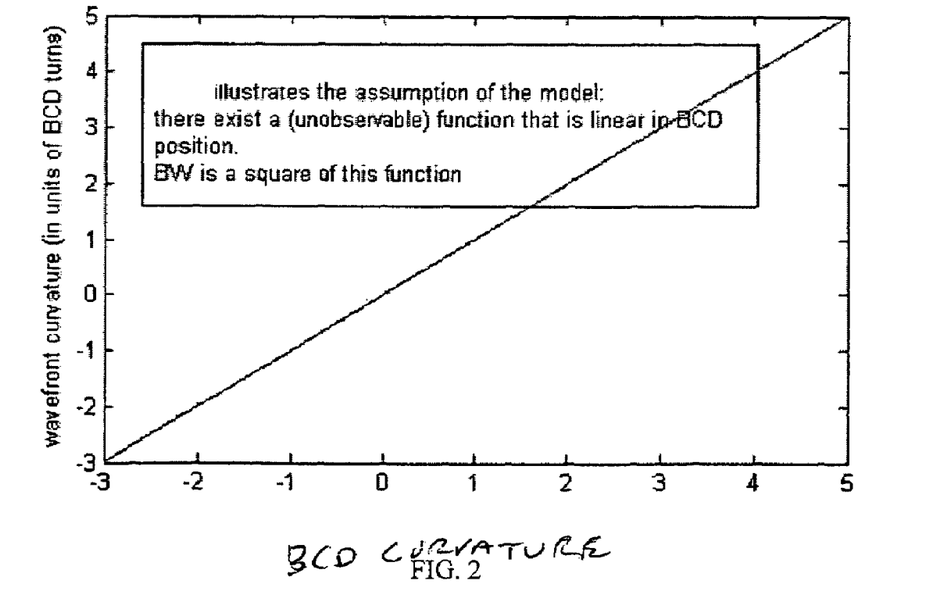
FIG. 2 illustrates by way of example that according to aspects of an embodiment of the present invention there can exist a theoretical relationship between bandwidth and, e.g., wavefront curvature, (e.g. in units of BCD turns) that is unobservable but useable if approximated effectively.

FIG. 2 illustrates by way of example that according to aspects of an embodiment of the present invention applicant believes that there can exist a theoretical relationship between bandwidth and, e.g., wavefront curvature. BCD turns that is generally in practice unobservable without complex and expensive instrumentation not ordinarily present in the metrology accompanying laser systems of the type noted in normal operation, but which attributes to the ability to construct a generally applicable model of system operation for bandwidth control. According to aspects of an embodiment of the present invention it may be assumed that (1) the wavefront curvature of light circulating in the laser cavity is a sum of (a) a BCD induced curvature (b) constant curvatures of all the other optics in the cavity (e.g., where a single BCD element is used to modify wavefront curvature) and (c) thermally-induced transient curvatures; (2) BW is a square (or a function that is very similar to a square) of the wavefront curvature. Since (b) does not change, it can be ignored for the present purposes. The effect of (c) is what is being tried to be controled out of the modifications of wavefront and (a) is the effect that one may control according to aspects of an embodiment of the present invention to cancel the effects of (c). Since, ordinarily, with metrology available on the laser system one cannot measure (c) individually or as a sum a+b+c, according to aspects of an embodiment of the present invention another parameter must be used and that may be bandwidth, e.g., $BW=f(a+b+c)\sim(a+b+c)^2$ Aspects of embodiments of the present invention can be based upon the fact that bandwidth of a laser system of the above noted type is a function of, e.g., the curvature of the light wavefront in the resonator, and, e.g., thus the wavefront incident on the center wavelength selection optics. Applicant's assignee's work has indicated that altering the curvature of a reflective element in the resonator imparts a cylindrical wavefront deformation, which leads to bandwidth change. Applicant's assignee's work has also indicated that the dependence is approximately quadratic around the operating point of interest, with the parabola minima for FWHM and E95 often offset with respect to each other, as noted above.

The change in the optical power in the laser light pulse production system, e.g., due to change in duty cycle, i.e., the percentage of time during a given stretch of time that the laser system is operating, e.g., at some selected pulse repetition rate, e.g. 4 kHz to 6 kHz or the like, can lead to both a transient change of bandwidth and a change in its steady-state value. These changes have been demonstrated by applicant's assignee through numerous what are called spike tests, where, e.g., the laser system is run for a time, e.g., hundreds of seconds at one duty cycle and then switched to another whereby the effect on output bandwidth is observed and shows the transients being dealt with according to aspects of an embodiment of the present invention. Such Thermal transients are thought to result from transient temperature gradients, e.g., in the LNM optics and in the purge gas, resulting in the creation of, e.g., transient refraction index gradients across the beam, which in turn can result in wavefront deformation. Fast transients have been observed on about a 3 sec time scale, e.g., in some of applicant's assignee's 7XXX laser systems, although such can also occur, e.g., in MOPA configured laser systems.

Applicant and applicant's assignee have noted that a large part of the BW transient and the steady-state offset is correctable with the BCD, implying that the transient thermally-induced lensing is largely cylindrical. According to aspects of an embodiment of the present invention applicant has noted that transients have been able to be corrected in recent experiments with a simple integral BCD feedback based on measured FWHM. According to aspects of an embodiment of the present invention the operating point can be chosen to be away from the area of the minimum where the non-linearity exists, e.g., on the right hand side of the BCD curve (corresponding to concave grating surface), as shown, e.g., in the area illustrated in FIG. 1. There, e.g., the bandwidth response to BCD actuation position is approximately linear, and where the bandwidth response to the thermally-induced wavefront deformation is also presumed to be approximately linear.

Feedback control is not feasible if the desired operating point is close to the minimum bandwidth due to the non-linearity of the change in bandwidth for a change in, e.g., BCD curvature actuator position.

Another thermally-induced optical path, e.g., in the LNM, phenomenon can be transient wavelength ("WL") shift (or passive drift). The driving mechanism is thought by applicant to be similar for the wavelength shift as for the bandwidth change, namely thermally driven wavefront change, e.g., wedge or slope in the case of the wavelength shift, cylindrical lensing in the case of bandwidth ("BW")changes. In other words, the wavefront tilts (in the plane of incidence on the dispersive optic without changing its shape. That is, the angle of incidence of light on the dispersive optic changes, as if a prism (wedge) appeared in the light path and deflected it. In the presence of, e.g., a dispersive optic the tilt results in the change of wavelength. The observable variable (wavelength) is linear in the amount of wavefront slope, unlike bandwidth, which is quadratic in the wavefront curvature. The wavelength response to step changes in optical power rate has been characterized and was found to be a linear function of the power deposition history. according to aspects of an embodiment of the present invention this response can be completely captured, e.g., by a linear combination of two or three exponential decay terms with different time constants and coefficients, where, e.g., the coefficients are not all of the same sign. WL passive drift may be seen as illustrative of BW thermal transient by analogy with WL passive drift, since the two phenomena have common physical origin(s).

According to aspects of an embodiment of the present invention certain assumptions have been made, based in part at least on the above discussion. These assumptions include that there exists a variable that is, e.g., essentially a linear time-invariant filter of the optical power for any BCD position, BCD (t). For purposes of discussion this filter can be referred to as "wavefront curvature," but it does not matter what it really is, e.g., since, as noted above, it is unobservable with the hardware that is presently available. While it is in principle possible to measure wavefront, and correct it based on the information from the measurement, this can require a wavefront sensor. Such a sensor would be a sophisticated piece of metrology equipment, which produces, e.g., large amounts of raw data that cannot be easily reduced without, e.g., significant additional processing power and other capabilities that are complex and costly to have as onboard metrology for the types of laser systems noted above. For example, large astronomical telescopes commonly incorporate a wavefront sensor and adaptive optics for active control of transient atmospheric aberrations to the wavefront, but such equipment is not practical for the operation of the types of lasers for which aspects of embodiments of the present invention are intended. an aspect of an embodiment of the present invention is to be able to control transient aberrations in the laser wavefront without the use of such expensive and complex instrumentation.

Since the filter is believed to act like wavefront curvature for purposes of aspects of an embodiment of the present invention, it may also be assumed, e.g., that it is a linear function of the BCD position, i.e., for example, wavefront curvature includes the current grating curvature (BCD actuator position setting) as an additive term. More specifically, the curvature κ(t) at any moment can be expressed as follows:

$$\kappa(t) = BCD(t) + A_0 + \int_{-\infty}^{t} \sum_{j=1}^{n} A_j P(t') \exp\left(-\frac{(t-t')}{\tau_j}\right) dt' \quad \text{Eq. (1)}$$

... where P(t) is a laser operating system power parameter. For a continuous wave ("CW") laser P(t) is its instantaneous power. For a pulsed laser, P(t) is its moving-averaged power, such that the time window of the moving average is much shorter than any thermal transient. Also $\tau_j$ are the time constants associated with each of the multiple(n) components contributing to transient wavefront deformations, and $A_j$ are the coefficients expressing the magnitudes of these components.

According to aspects of an embodiment of the present invention the particular functional form, namely a linear combination of exponentials, can be justified because that is the form of the temporal component of the general solution of the heat transfer equation. This functional form is thought to represent the wavefront curvature because the curvature is created by refraction index gradients, the refraction index can be considered to be linear with temperature, and the temperature is linear with power deposition because heat transfer is a linear processs. The −∞ in the integral limit for all practical purposes can be replaced by t−T, so that integration is over a finite fixed time interval that is longer than any transient: T>>$\tau_j$ for all j. In the case of a pulsed laser, this equation, instead of using integration, can also be rewritten as a sum over discrete pulses. The number of terms n required for a satisfactory fit is believed to be no more than 3, which means that the model in the worst case may have 6 parameters (3 time constants and 3 coefficients.

According to aspects of an embodiment of the present invention the circulating optical power in the resonator, represented by P(t) can be difficult to determine, however, the output power of the laser system, e.g., out of a single chamber laser system or out of the MO of a MOPA laser system can be viewed as having a linear enough relationship to the pertinent optical train power to be a reasonable substitute for it.

The bandwidth is a deterministic nonlinear function of the instantaneous wavefront curvature and nothing else, at least on the time scale relevant to the transients being considered, e.g., ignoring changes due to other relatively long time scale effects on bandwidth, e.g., halogen content in the laser system, e.g., $F_2$ content. That is, there is a one-to-one relationship between the value of the wavefront curvature and the value of bandwidth, as illustrated by the curve in FIG. 1. The relationship is not a straight line, i.e., non-linear.

Also, according to aspects of an embodiment of the present invention, since there are regions of BCD settings curve(s) where bandwidth can be linearized, e.g., with respect to the wavefront curvature with acceptable accuracy, even though not necessarily the regions where one would want to actually operate the laser system, this linearity in such region(s) can, e.g., be used to calibrate the coefficients and time constants in the above referenced model transient equation.

Thus, according to aspects of an embodiment of the present invention characterization and model calibration can be carried out by choosing a fixed BCD position on the curve 20, 22, e.g., far enough from the minimum (most practically, e.g., on the concave branch of the curve) so the BW vs curvature is approximately linear for any transient. Applicant believes that characterization near the bandwidth minimum would not produce useable data because of the non-linearity in any reasonably small control algorithm, without, e.g., 1) a linearizing sensor, e.g. an actual wavefront sensor of some kind or 2) a much more complicated non-linear control algorithm, e.g., the use of neural nets or any of the other post-modern control schemes which are far too complex, uncertain and costly or computationally too time consuming for practical effect.

Thereafter, according to aspects of an embodiment of the present invention one can run a test sequence that exercises the laser duty cycle, e.g., a spike test as noted above. Then, one can choose, at least a second BCD position in the same linear region, and, e.g., repeat the test top obtain observed bandwidth transients for each BCD position. One can then fit the observed bandwidth transients from the at least two runs to the equation (1) and determine the model coefficients from the fit, up to a linear transformation, the overall offset and scale not being important because the goal is, e.g., to keep bandwidth constant across a thermal transient(s). The particular value of BW will vary on the longer timescale e.g. with F2 concentration, and will also depend, e.g., on the chosen initial BCD setting. The additive constant in the model is therefore immaterial for the purposes of transient suppression. The multiplicative coefficient is also immaterial because it depends on the BCD curve slope at the (arbitrary) BCD setting chosen for calibration; the slope cancels out if two BCD positions are used for a fit as described.

According to aspects of an embodiment of the present invention the model may then be tested and verified, e.g., by setting the BCD to a selected initial position, e.g., at the minimum of bandwidth on the curve 20 or the curve 22 and, using the model coefficients so determined in Eq. (1), generate a BCD(t) drive signal such that it keeps the κ(t)=const. Verify that the transient is controlled out for the initial BCD setting at the minimum bandwidth. This can also be tested and verified elsewhere on the respective curve 20, 22, e.g., relatively near the minimum where the bandwidth response is also relatively non-linear, or anywhere else. This model may than be used as, e.g., a feed forward part of the a bandwidth control algorithm.

Thereafter once the model has been verified, the same characterization and calibration may be used as a periodic calibration procedure.

The control signal to the BCD, e.g., to maintain κ(t)=const can be purely optical power-based, e.g., duty cycle based. It can be a feed forward signal, e.g., designed to keep κ(t)= const. A feedback part that ensures that the bandwidth controller stays within, e.g., some selected range of bandwidths, may be utilized, e.g., with a more slowly changing parameter that impacts bandwidth, e.g., with fluorine content control. The starting default 'cold steady-state' BCD position can be adjusted at calibration with fresh gas to either center the E95 in the desired range or just minimize it. Alternatively, a slow BCD dither can be used to provide slow feedback to keep the BCD at bandwidth minimum in steady state, with the fast feed-forward signal additive to the slow feedback signal.

Figure 3:
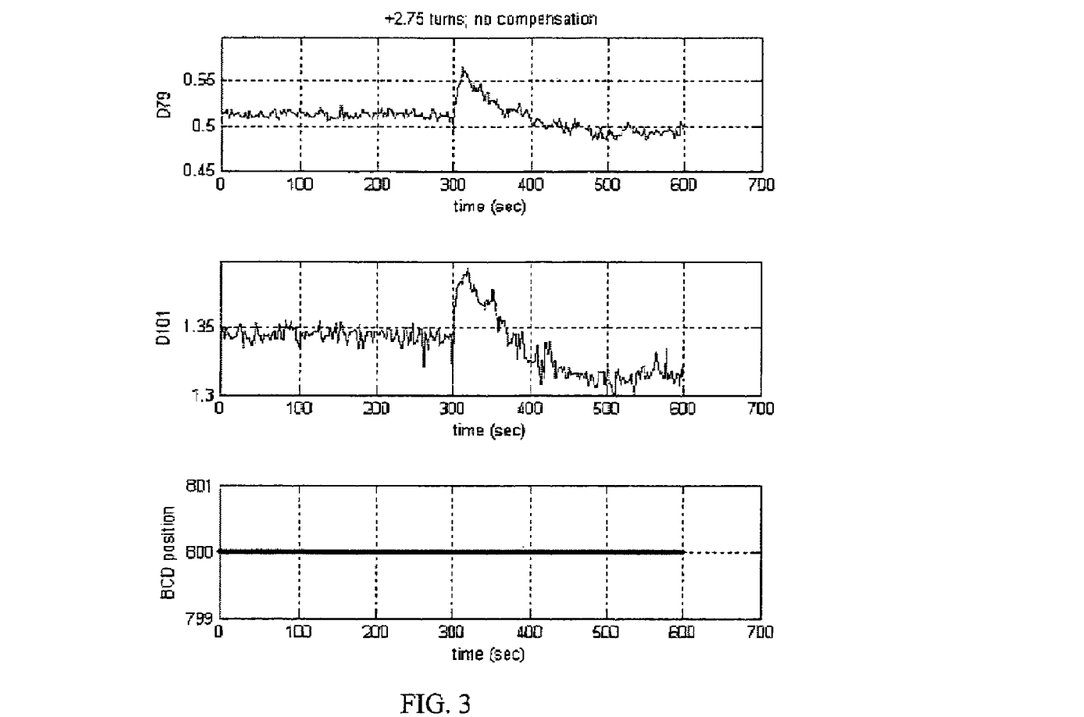
FIG. 3 illustrated a step change transient without BCD control useful in understanding aspects of a embodiments of the present invention.

Turning now to FIG. 3 there is shown the results of an exemplary step test where, e.g., the BCD is initially set at 2.75 turns, i.e., 550 steps, at 200 steps per turn on the positive side of the BCD curve, e.g., where the curvature of the incidence surface of the grating, the grating face, is concave, with five minutes (300 seconds) at a first duty cycle of 5%, and then a change to a second duty cycle of 75%, and no compensation by changing the BCD setting. FIG. 3 shows that for FWHM, the top curve and E95, the middle curve, there results a transient in the D79 and D101 values of roughly the same shape, with an initial rise to a peak and then a gradual settling to a steady state level that is lower than the level before the duty cycle transient.

Figure 4:
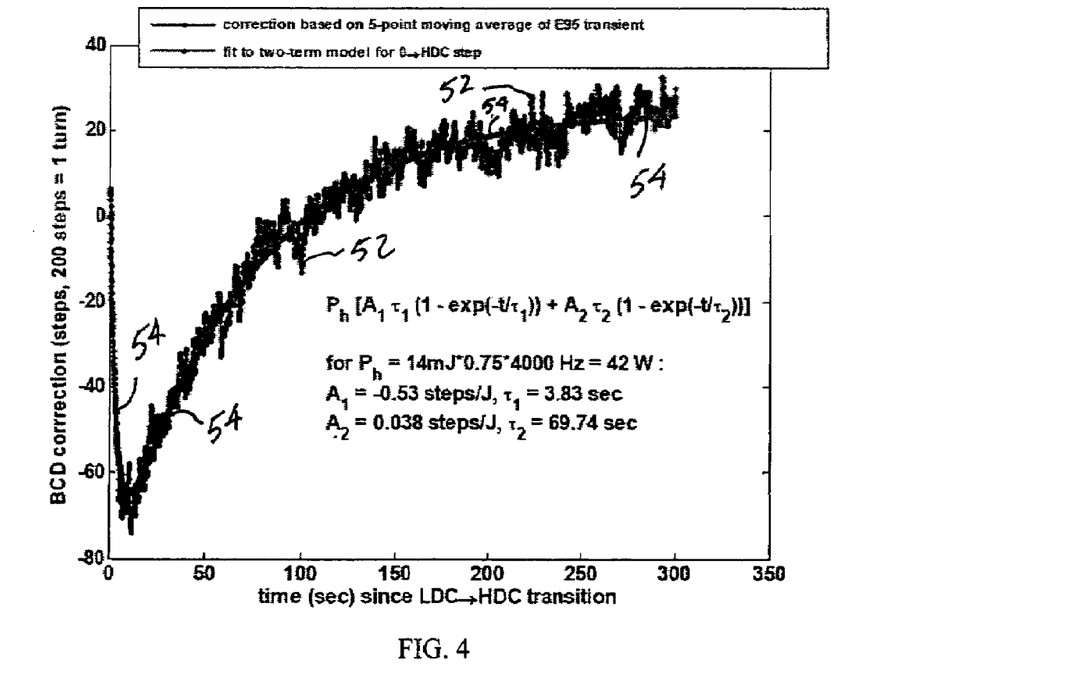
FIG. 4 illustrates an inverse of a transient useful in understanding aspects of embodiments of the present invention.

Such a bandwidth transient can be modeled according to the above described model, e.g., as illustrated in FIG. 4. As shown in FIG. 4, a BCD position correction can be modeled, e.g., using a five point moving average 52 of, e.g., the inverse of one of the transients and, e.g., a slope in the relatively linear +2.75 portion of the bandwidth curve, e.g., of FIG. 1, of 0.2 pm per turn on the BCD curvature actuator as described below in regard to FIG. 9. This correction, as shown in FIGS. 4-6 to be roughly 70 steps, i.e., 7/25 of a negative (counter-clockwise) turn at the peak, and settling back to roughly 20 steps further in the positive (clockwise) direction (e.g., more concave) than before the duty cycle transient. This can then be smoothed, e.g., as shown by the curve 54 in FIG. 4 and fit to the model of Eq. 1 to determine the relevant coefficients and time constants, e.g., for a $P_h$ of 14 mJ at a duty cycle of 0.75 for a 4 kHz pulse repetition rate, i.e., 42 W of laser output power, $A_1$=0.53 steps/J, $A_2$=0.038 steps/J, $\tau_1$=3.83 sec and $\tau_2$=69.73 sec.

Figure 5:
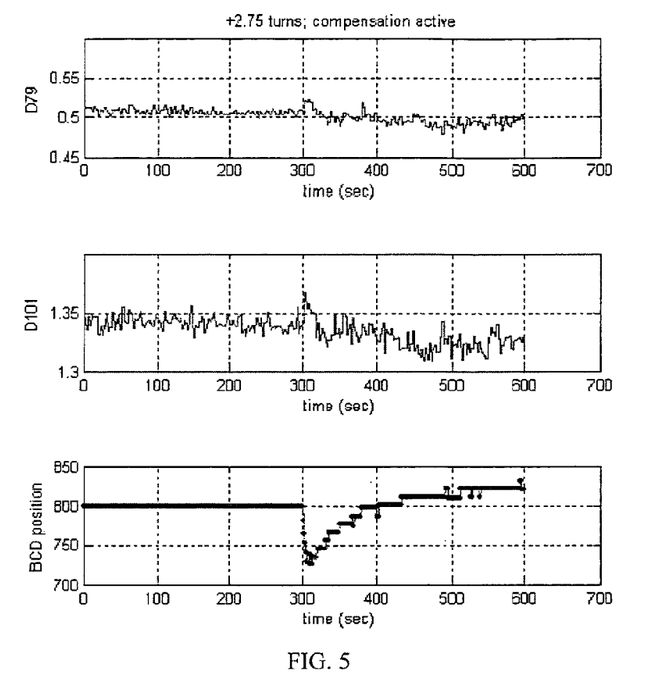
FIGS. 5-7 illustrate transients with correction according to aspects of embodiments of the present invention.
Figure 6:
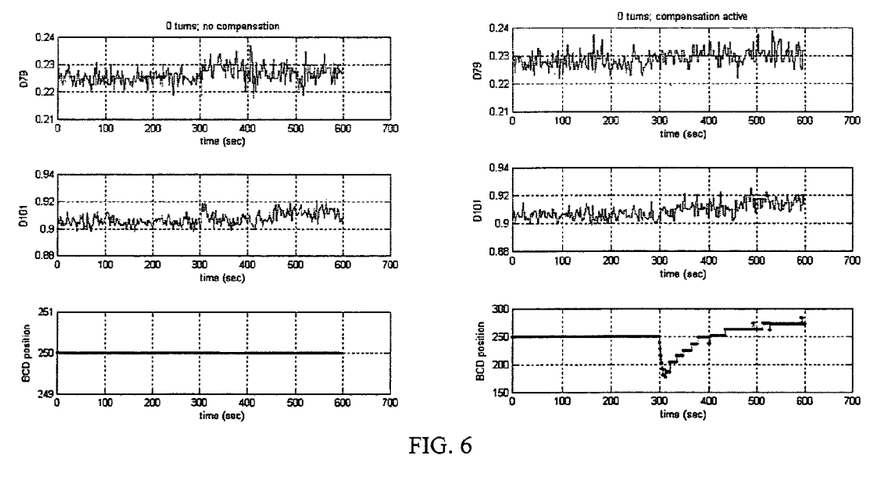
Figure 7:
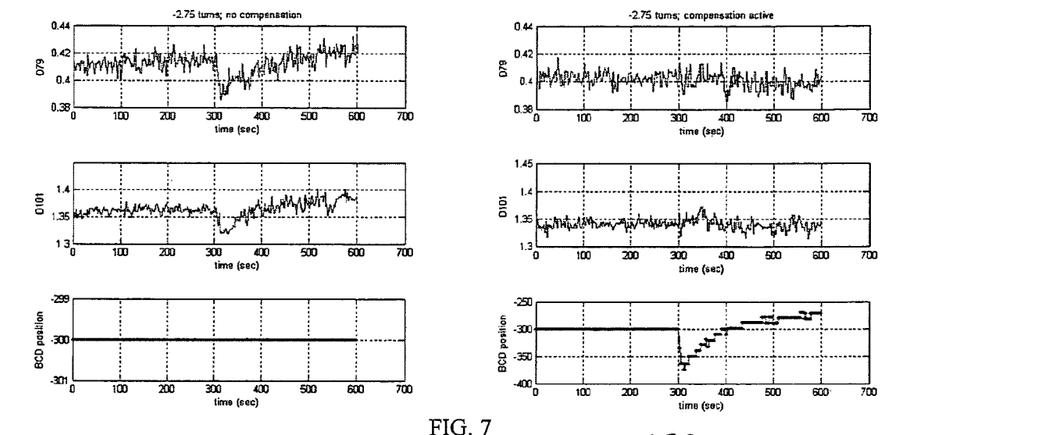

As can be seen from FIG. 5, using this same correction at plus 2.75 turns as a feed forward correction for the duty cycle transient, e.g., initiating at the initiation of the change in duty cycle, the FWHM and E95 bandwidth transients are substantially eliminated. In addition the same model derived BCD correction applied at the 0 turns position of the BCD curvature actuator and the −2.75 (convex) position of the BCD curvature actuator also result in substantial elimination of the bandwidth transient in the step tests therein illustrated in FIGS. 6 and 7.

Figure 8:
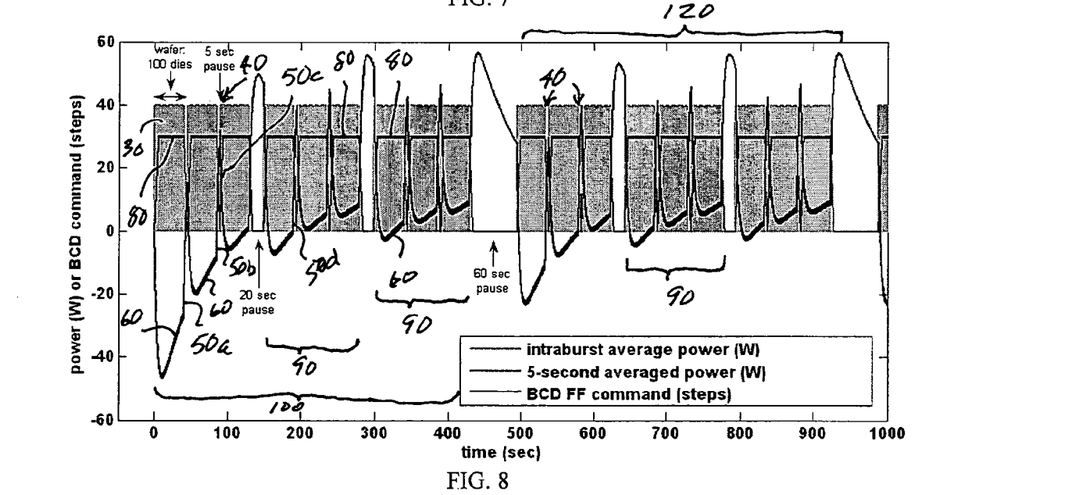
FIG. 8 illustrates transient correction according to aspects of embodiments of the present invention.

Turning now to FIG. 8 there is illustrated by way of example a somewhat typical laser system operation, e.g., for integrated circuit lithography light source operation wherein is shown an operation whereby, e.g., a plurality if integrated circuit die on an integrated circuit fabrication wafer are irradiated for photolithography purposes, e.g., 100 die, necessitating a plurality of bursts 40 (one or more per die), each exhibiting an intraburst power 30 in watts, which may have short inter-die downtime. This short intra-die downtime may be reflected in transients that cause, according to aspects of an embodiment of the present invention the changes in BCD curvature actuator position reflected in the intra-die portions 60 of the BCD feed-forward correction curve 50. The power in watts, e.g., a five second average power 70 may exist at the output of the laser system during the bursts for a given wafer.

A brief downtime 80 between wafers, e.g., for the replacement of one wafer with another may also cause a transient as, e.g., the power being absorbed in at least some portion(s) of the laser system optical train, e.g., in the laser resonator cavity including, e.g., an output coupler and LNM. During such a transient, it can be seen that the controller system using the feed forward algorithm first changes the BCD curvature actuator position in one direction to account for the reduction in power absorption, and then, as the next series of bursts occurs to irradiate multiple dies on an subsequent wafer changes the BCD curvature correction actuator in the opposite direction to accommodate wavefront changes occurring as the power absorption increases to some duty cycle.

Figure 9:
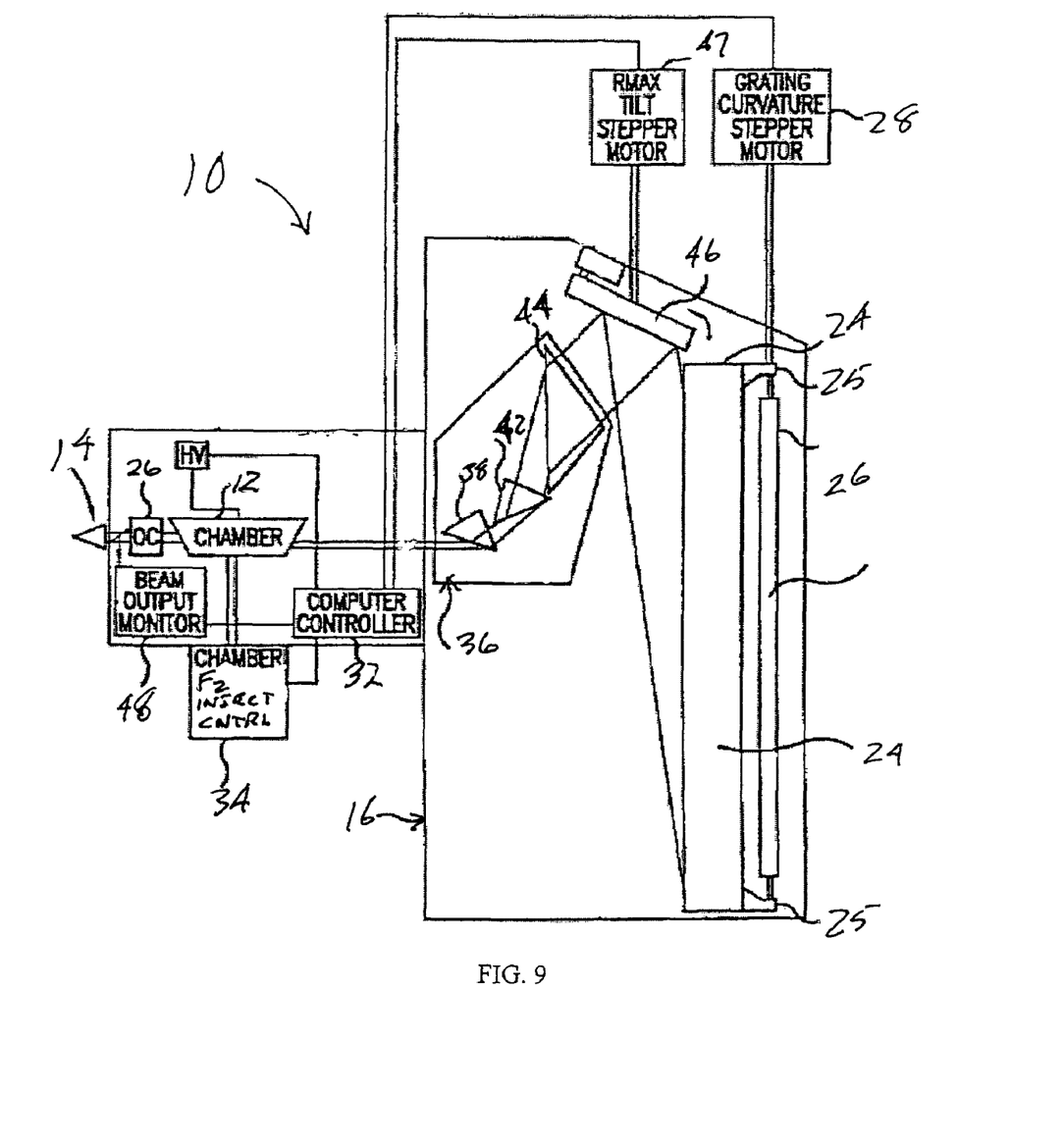
FIG. 9 illustrates partly schematically in block diagram form a bandwidth controller according to aspects of an embodiment of the present invention.
Figure 10:
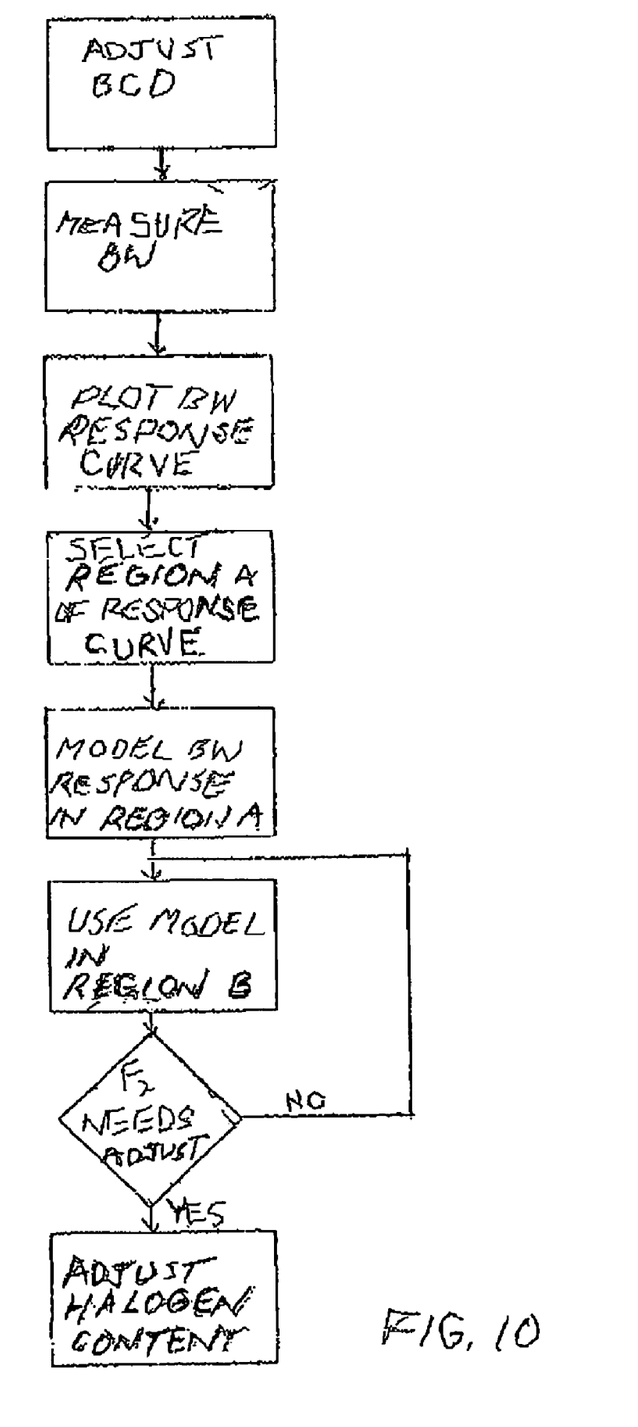
FIG. 10 illustrates by way of example in a flow chart form process steps according to aspects of an embodiment of the claimed subject matter.

Turning now to FIG. 9 there is shown in schematic and partly block diagram form an example of a bandwidth control system for a laser system 10 according to aspects of an embodiment of the present invention. The laser system 10 may include, e.g., a laser chamber 12 in which lasing occurs to produce an output laser light pulse beam 1, which can exist the laser system through an output coupler 26 and be monitored by a beam monitor 48, which can monitor, e.g., beam quality parameters, such as center wavelength, bandwidth, pulse energy, etc. At the opposing side of the laser chamber 12 can be positioned a line narrowing module or package ("LNM" or "LNP") 16, which may consists of, e.g., a wavelength election optical element, e.g., a dispersive optical element, e.g., a reflective grating 24, which as is well known in the art can also serve as the rear mirror forming the laser system resonator cavity along with the output coupler 26. Those skilled in the art will also appreciate that the laser system 10 can be a part of a multi-chamber laser system, e.g., a master oscillator-power amplifier ("MOPA") laser system where the laser output light pulse beam 14 forms the input to an amplifier portion of the system (not shown), where, e.g., the output beam from chamber 12 is amplified, e.g., in an excited lasing gas medium in one or more amplifier portions timed to be excited as the beam 14 makes a selected number of passes through a discharge region between electrodes in the chamber of the amplifier portion or where the output laser light pulse beam 14 seeds one or more amplifier portions (not shown) which may also be an oscillating laser cavity, i.e., a master oscillator-power oscillator ("MOPO") or like multi-chamber laser systems.

The grating 24 of the LNM 16 may have a grating surface of incidence curvature adjustment mechanism, e.g., a threaded mechanism 26, which may, e.g., apply compressive or tensional force to the grating 24 by expanding or contracting between two opposing stanchions 25 attached to the back of the grating 24 at either end thereof. In this manner the surface of incidence of the laser light pulse beam on the front of the grating 24, e.g., after passing through a beam expander 36 made up of prisms 38, 42 and 44, can be changed from generally flat to having some shape, e.g., a curved surface, e.g., generally concave or convex cylindrical curvature.

The LNM may also comprise a center wavelength tuning mechanism, e.g., a mirror 46 that may be controlled by a center wavelength controller, which may be a part of a laser system controller 32, which may be, e.g., one or more programmed or hard wired computer processors, e.g., microprocessors or microcontrollers that perform the control functions for the laser system 10, including those discussed in the present application regarding control of center wavelength, bandwidth and/or $F_2$ or other halogen gas injection into the laser system chamber 12 in a one chamber or multi-chamber laser system to produce the desired ultimate laser output light pulse from the entire system as appropriate.

It will also be appreciated by those skilled in the art that the above BCD is exemplary and that the particular number of turns involved and number of steps on a BCD stepper motor 28 to achieve one turn are exemplary only and, e.g., other means of changing the shape of the surface of incidence of the grating 24 may be used, e.g., pneumatic, hydraulic or electrically actuated, e.g., piezoelectric means of applying the appropriate forces to achieve the desired shape, e.g., a concave or convex generally cylindrical curvature and there may be more than one BCD actuator, e.g., changing the shape of the grating surface of incidence in different ways, as explained in an above referenced co-pending patent application. It will also be understood that each of the actuators may be controlled by a single bandwidth controller in the laser system controller 32, e.g., using the same model equation or using a different model equation for at least one other of a plurality of actuators. For example the wavefront and its influence on different types of measures of bandwidth, e.g., FWXM, full width at some percentage X of the max or EXX, the energy integral for some percentage XX of the entire energy in the spectrum centered about the center wavelength may be modified each according to its own model equation for thermal or other transient control, e.g., by separate BCD connected to the grating or by modifying the grating surface of incidence shape for the one and some other aspect of the laser system optical train to modify the other to accommodate transients in each of the FWXM and EXX bandwidth measurements. Further in the case of multiple shaping actuators such as multiple BCDs 26 both may be controlled according to the model equation as noted herein or one may be and the other may not, in which event, the other may be controlled, e.g., based on some empirically determined model that accounts for the effect of the one being controlled as noted herein on the shape control needed to be provided by the other to achieve the results noted herein. It will also be appreciated by those in the art that one BCD may be actuated according to aspects of the present invention for bandwidth transient control and another, either on the grating 24 or elsewhere actuated to modify wavefront effects on center wavelength.

A slightly longer down time may then occur, e.g., as a new batch 90 of wafers is shifted into a photolithography scanner and the previously irradiated batch 90 removed, before the first wafer in the next batch is begun to be irradiated. During this time, as the power goes to a zero duty cycle, and the laser system optical train accordingly cools for this more extended time, e.g., about 20 seconds, the controller, using the feed forward algorithm of the model adjusts the BCD curvature correction actuator accordingly. Similarly a still longer down time of about 60 seconds may occur, e.g., as the scanner performs some other function between processing one group 100 of batches 90 of wafers and a subsequent group 120 of batches 90 of wafers.

Those skilled in the art will appreciate that the feed forward algorithm according to the model is cumulative over time, such that, e.g., at the beginning of the first group 100 of batches 90 of wafers, before which, e.g., the laser system may have been idle for a long time, e.g., essentially starting cold, the transient to be corrected may be quit large, e.g., as the laser system goes from, e.g., essentially cold to hot in the course of one the irradiation of the first wafer, including the small transients indicated at 60 as the scanner shifts between die being irradiated. However, after the relatively short down time of, e.g., 5 sec. between wafers, the transient and the necessary BCD curvature correction actuator position adjustment 50b is relatively smaller, since the optical train cools, but not as much as before wafer one was started. Similarly as can be seen in FIG. 8 with a similar approximately 5 second downtime the magnitude of the next correction 50c is still smaller since the laser system optical train over the preceding time has heated even more and cools lass in the five second transient and thus the needed correction 50c is slightly smaller than that needed for transient correction feed forward signal 50b. also as can be seen after an even longer cooling of 20 seconds, but also after the completion of the irradiation of a first batch of wafers, e.g., in a first group 100 of batches 90 of wafers, due, e.g., to cooling of the laser system optical train in the twenty second down time the correction signal 50 will exceed the prior one 50c for the last wafer in the first batch 90, but will not need to be as large as the correction signal 50a for the first wafer with the system starting cold, or ever, perhaps for the second correction signal 50b. Finally, after the still longer down time of 60 seconds the first BCD curvature correction actuator signal 50e may be larger than, e.g., all of the others in the first batch, except for the first 50a correcting for the fact that the laser system was started from a colder condition, e.g., considered to be cold startup after an even longer downtime than 60 seconds.

It will be understood by those skilled in the art that a gas discharge laser system bandwidth control mechanism and method of operation for controlling bandwidth in a laser output light pulse generated in the gas discharge laser system is disclosed in the present application which may comprise a bandwidth controller which may comprise an active bandwidth adjustment mechanism, e.g., the combination of a wavelength selection optical element such as is shown as an example in FIG. 9, e.g., including a so-called bandwidth control device ("BCD") to change the shape of a surface of incidence of, e.g., an expanded laser light pulse beam on the center wavelength selection optical element, e.g., an eschelle grating; a controller actively controlling the active bandwidth adjustment mechanism utilizing an algorithm implementing bandwidth thermal transient correction based upon a model of the impact of laser system operation on the wavefront of the laser light pulse being generated and line narrowed in the laser system, e.g., utilizing the grating and the BCD to change the shape of the surface of incidence, e.g., containing the grooves of the grating, as the wavefront is incident on the bandwidth adjustment mechanism. The controller algorithm may comprises a function of the power deposition history in at least a portion of an optical train of the gas discharge laser system, e.g., a linear function, e.g., a combination of a plurality of decay functions each comprising a respective decay time constant and a respective coefficient. The plurality of decay functions may comprise up to three separate decay functions, and each may comprise a different decay time constant and a different coefficient. The apparatus and method may comprise a gas discharge laser system bandwidth control mechanism for controlling bandwidth in a laser output light pulse generated in the gas discharge laser system which may comprise a bandwidth controller which may comprise an active bandwidth adjustment mechanism, which may comprise a dispersive optical element operative to select a center wavelength for the laser output light pulse, e.g., the grating in combination with an actively controlled BCD, and may further comprise a surface of incidence, e.g., the face of the grating containing the grating center wavelength selection grooves, having an adjustable wavefront shape the effect of the wavefront shape on the bandwidth of a spectrum surrounding the selected center wavelength being represented by a curve plotting the bandwidth response to a selected curvature of the surface of incidence; a bandwidth controller controlling the adjustable wavefront shape utilizing an algorithm implementing bandwidth thermal transient correction based upon a model of the impact of laser system operation on the wavefront of the laser light incident on the surface of the bandwidth adjustment mechanism; wherein the bandwidth controller algorithm may be calibrated in a region of the curve where the bandwidth response to a selected change in curvature of the surface of incidence is relatively linear and the calibrated bandwidth controller algorithm is used for bandwidth thermal transient correction in a region of the curve where the bandwidth response to a selected change in curvature of the surface of incidence is relatively non-linear. The apparatus and method may comprise a gas discharge laser system bandwidth control mechanism for controlling bandwidth in a laser output light pulse generated in the gas discharge laser system which may comprise a bandwidth controller which may comprise an active bandwidth adjustment mechanism; a controller controlling the active bandwidth adjustment mechanism utilizing an algorithm which may comprise the implementation of short term bandwidth control based upon a model of the impact of laser system operation on the wavefront of the laser light pulse being generated and line narrowed in the laser system as it is incident on the bandwidth adjustment mechanism; and the implementation of long term bandwidth control based upon adjusting a halogen gas content in a lasing gas mixture in the gas discharge laser system. The apparatus and method may comprise a gas discharge laser system bandwidth control mechanism for controlling bandwidth in a laser output light pulse generated in the gas discharge laser system which may comprise a bandwidth controller which may comprise an active bandwidth adjustment mechanism; a controller controlling the active bandwidth adjustment mechanism utilizing an algorithm which may comprise a feed forward control function based upon a model of bandwidth fluctuation in response to a change in the time average of the heat load on at least a portion of the laser system optical train. The method and apparatus may comprise a gas discharge laser system bandwidth control mechanism for controlling bandwidth in a laser output light pulse generated in the gas discharge laser system which may comprise a bandwidth controller which may comprise a short term transient compensation mechanism which may comprise an active bandwidth adjustment mechanism which may comprise a dispersive optical element operative to select a center wavelength for the laser output light pulse and further may comprise a surface of incidence having an adjustable wavefront shape where the effect on the bandwidth of a spectrum surrounding the selected center wavelength can be represented by a curve plotting the bandwidth response to a selected curvature of the surface of incidence; a bandwidth controller algorithm implementing bandwidth thermal transient correction based upon a model of the impact of laser system operation on the wavefront of the laser light incident on the surface of the bandwidth adjustment mechanism; and a long term bandwidth control algorithm which may comprise adjusting a halogen gas content in a lasing gas mixture in the gas discharge laser system. The method and apparatus may comprise deriving the model from changes in bandwidth induced by changes in the curvature of the surface of incidence in a region of the curve where the response is relatively linear and using that model in a desired operating range of the laser system where the response is relatively non-linear.

In combination with the modifications to bandwidth control in the short term, e.g., intraburst corrections and from burst to burst as noted above, for example, the laser system parameters may also be controlled using halogen gas, e.g., fluorine gas, injection to control the lasing medium gas composition to keep laser parameters within some desired operating over a longer period of operating time, e.g., between gas refills as are well known in the art to be conducted periodically as the laser system operates and consumes halogen, e.g., fluorine, gas.

While the particular aspects of embodiment(s) of the METHOD AND APPARATUS FOR GAS DISCHARGE LASER BANDWIDTH AND CENTER WAVELENGTH CONTROL described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the present invention are merely exemplary, illustrative and representative of the subject matter which is broadly contemplated by the present invention. The scope of the presently described and claimed aspects of embodiments fully encompasses other embodiments which may now be or may become obvious to those skilled in the art based on the teachings of the Specification. The scope of the present METHOD AND APPARATUS FOR GAS DISCHARGE LASER BANDWIDTH AND CENTER WAVELENGTH CONTROL is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act".

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention(s) that will be understood and appreciated by those skilled in the art. The appended claims are intended in scope and meaning to cover not only the disclosed aspects of embodiments of the present invention(s) but also such equivalents and other modifications and changes that would be apparent to those skilled in the art. In additions to changes and modifications to the disclosed and claimed aspects of embodiments of the present invention(s) noted above others could be implemented.

We claim:

1. A gas discharge laser system bandwidth control mechanism for controlling bandwidth in a laser output light pulse generated in the gas discharge laser system comprising:
    a bandwidth controller comprising:
    an active bandwidth adjustment mechanism; and,
    a controller actively controlling the active bandwidth adjustment mechanism operatively implementing an algorithm implementing bandwidth thermal transient correction based upon a model of the impact of laser system operation on the wavefront of the laser light pulse being generated and line narrowed in the laser system as it is incident on the bandwidth adjustment mechanism.

2. The apparatus of claim 1 further comprising:
the controller algorithm comprises a function of the power deposition history in at least a portion of an optical train of the gas discharge laser system.

3. The apparatus of claim 1 further comprising:
the controller algorithm comprises a linear function of the power deposition history in at least a portion of an optical train of the gas discharge laser system.

4. The apparatus of claim 1 further comprising:
the controller algorithm comprises a combination of a plurality of decay functions each comprising a respective decay time constant and a respective coefficient.

5. The apparatus of claim 2 further comprising:
the controller algorithm comprises a combination of a plurality of decay functions each comprising a respective decay time constant and a respective coefficient.

6. The apparatus of claim 3 further comprising:
the controller algorithm comprises a combination of a plurality of decay functions each comprising a respective decay time constant and a respective coefficient.

7. The apparatus of claim 4 further comprising:
the plurality of decay functions comprises three separate decay functions.

8. The apparatus of claim 5 further comprising:
the plurality of decay functions comprises three separate decay functions.

9. The apparatus of claim 6 further comprising:
the plurality of decay functions comprises three separate decay functions.

10. The apparatus of claim 7 further comprising:
the plurality of decay functions each comprises a different decay time constant and a different coefficient.

11. The apparatus of claim 8 further comprising:
the plurality of decay functions each comprises a different decay time constant and a different coefficient.

12. The apparatus of claim 9 further comprising:
the plurality of decay functions each comprises a different decay time constant and a different coefficient.

13. A gas discharge laser system bandwidth control mechanism for controlling bandwidth in a laser output light pulse generated in the gas discharge laser system comprising:
a bandwidth controller comprising:
an active bandwidth adjustment mechanism comprising a dispersive optical element operative to select a center wavelength for the laser output light pulse and further comprising a surface of incidence having an adjustable wavefront shape the effect of the wavefront shape on the bandwidth of a spectrum surrounding the selected center wavelength being represented by a curve plotting the bandwidth response to a selected curvature of the surface of incidence; and
a controller controlling the adjustable wavefront shape operatively implementing an algorithm implementing bandwidth thermal transient correction based upon a model of the impact of laser system operation on the wavefront of the laser light incident on the surface of the bandwidth adjustment mechanism;
wherein the bandwidth controller algorithm is calibrated in a region of the curve where the bandwidth response to a selected change in curvature of the surface of incidence is relatively linear and the calibrated bandwidth controller algorithm is used for bandwidth thermal transient correction in a region of the curve where the bandwidth response to a selected change in curvature of the surface of incidence is relatively non-linear.

14. The apparatus of claim 13 further comprising:
the controller algorithm comprises a function of the power deposition history in at least a portion of an optical train of the gas discharge laser system.

15. The apparatus of claim 13 further comprising:
the controller algorithm comprises a linear function of the power deposition history in at least a portion of an optical train of the gas discharge laser system.

16. The apparatus of claim 3 further comprising:
the controller algorithm comprises a combination of a plurality of decay functions each comprising a respective decay time constant and a respective coefficient.

17. The apparatus of claim 14 further comprising:
the controller algorithm comprises a combination of a plurality of decay functions each comprising a respective decay time constant and a respective coefficient.

18. The apparatus of claim 15 further comprising:
the controller algorithm comprises a combination of a plurality of decay functions each comprising a respective decay time constant and a respective coefficient.

19. The apparatus of claim 16 further comprising:
the plurality of decay functions comprises three separate decay functions.

20. The apparatus of claim 17 further comprising:
the plurality of decay functions comprises three separate decay functions.

21. The apparatus of claim 18 further comprising:
the plurality of decay functions comprises three separate decay functions.

22. The apparatus of claim 19 further comprising:
the plurality of decay functions each comprises a different decay time constant and a different coefficient.

23. The apparatus of claim 20 further comprising:
the plurality of decay functions each comprises a different decay time constant and a different coefficient.

24. The apparatus of claim 21 further comprising:
the plurality of decay functions each comprises a different decay time constant and a different coefficient.

25. A gas discharge laser system bandwidth control mechanism for controlling bandwidth in a laser output light pulse generated in the gas discharge laser system comprising:
a bandwidth controller comprising:
an active bandwidth adjustment mechanism;
a controller controlling the active bandwidth adjustment mechanism operatively implementing an algorithm operatively implementing bandwidth thermal transient control comprising:
a feed forward control function based upon a model of bandwidth fluctuation in response to a change in the time average of the heat load on at least a portion of the laser system optical train.

26. A gas discharge laser system bandwidth control mechanism for controlling bandwidth in a laser output light pulse generated in the gas discharge laser system comprising:
a bandwidth controller comprising:
a short term transient compensation mechanism comprising:
an active bandwidth adjustment mechanism comprising a dispersive optical element operative to select a center wavelength for the laser output light pulse and further comprising a surface of incidence having an adjustable wavefront shape where the effect on the bandwidth of a spectrum surrounding the selected center wavelength can be represented by a curve plotting the bandwidth response to a selected curvature of the surface of incidence;

a bandwidth controller algorithm operatively implementing bandwidth thermal transient correction based upon a model of the impact of laser system operation on the wavefront of the laser light incident on the surface of the bandwidth adjustment mechanism; and, a long term bandwidth control algorithm comprising:

adjusting a halogen gas content in a lasing gas mixture in the gas discharge laser system.

27. A method of operating a gas discharge laser system bandwidth control mechanism for controlling bandwidth in a laser output light pulse generated in the gas discharge laser system comprising:

utilizing a bandwidth controller operatively implementing:

a short term transient compensation method comprising:

using an active bandwidth adjustment mechanism comprising a dispersive optical element operative to select a center wavelength for the laser output light pulse and further comprising a surface of incidence having an adjustable wavefront shape where the effect on the bandwidth of a spectrum surrounding the selected center wavelength can be represented by a curve plotting the bandwidth response to a selected curvature of the surface of incidence;

using a bandwidth controller algorithm implementing bandwidth thermal transient correction based upon a model of the impact of laser system operation on the wavefront of the laser light incident on the surface of the bandwidth adjustment mechanism; and, a long term bandwidth control method comprising:

adjusting a halogen gas content in a lasing gas mixture in the gas discharge laser system.

28. The method of claim 27 further comprising:

deriving the model from changes in bandwidth induced by changes in the curvature of the surface of incidence in a region of the curve where the response is relatively linear and using that model in a desired operating range of the laser system where the response is relatively non-linear.

29. The method of claim 28 further comprising:
the long term comprises a time between halogen gas refills.

30. The method of claim 28 further comprising:
the long term comprises a time between halogen gas refills.

31. A method of operating a gas discharge laser system bandwidth control mechanism for controlling bandwidth in a laser output light pulse generated in the gas discharge laser system comprising:

utilizing a bandwidth controller operatively implementing:

a short term transient compensation method comprising:

using an active bandwidth adjustment mechanism comprising a dispersive optical element operative to select a center wavelength for the laser output light pulse and further comprising a surface of incidence having an adjustable wavefront shape where the effect on the bandwidth of a spectrum surrounding the selected center wavelength can be represented by a curve plotting the bandwidth response to a selected curvature of the surface of incidence;

using a bandwidth controller algorithm implementing bandwidth thermal transient correction based upon a model of the impact of laser system operation on the wavefront of the laser light incident on the surface of the bandwidth adjustment mechanism; and, a long term laser parameter control method comprising:

adjusting a halogen gas content in a lasing gas mixture in the gas discharge laser system.

32. The method of claim 31 further comprising:

deriving the model from changes in bandwidth induced by changes in the curvature of the surface of incidence in a region of the curve where the response is relatively linear and using that model in a desired operating range of the laser system where the response is relatively non-linear.

33. The method of claim 31 further comprising:
the long term comprises a time between halogen gas refills.

34. The method of claim 32 further comprising:
the long term comprises a time between halogen gas refills.

* * * * *